United States Patent
Lowles et al.

(10) Patent No.: US 7,408,786 B2
(45) Date of Patent: Aug. 5, 2008

(54) ELECTRICAL CONNECTOR AND SYSTEM FOR A COMPONENT IN AN ELECTRONIC DEVICE

(75) Inventors: Robert Lowles, Waterloo (CA); James Robinson, Elmira (CA); Robert Phillips, Waterloo (CA); Jacek Idzik, Kenilworth (CA); Jason Griffin, Kitchener (CA); Marc Drader, Kitchener (CA)

(73) Assignee: Research in Motion Limited, Waterloo, Ontario (CA)

( * ) Notice: Subject to any disclaimer, the term of this patent is extended or adjusted under 35 U.S.C. 154(b) by 204 days.

(21) Appl. No.: 11/150,138

(22) Filed: Jun. 13, 2005

(65) Prior Publication Data

US 2006/0279939 A1  Dec. 14, 2006

(51) Int. Cl.
*H05K 7/00* (2006.01)
(52) U.S. Cl. .................. 361/760; 361/792; 361/809
(58) Field of Classification Search ............... 361/760, 361/783, 792, 809; 257/768; 324/765, 104; 29/840
See application file for complete search history.

(56) References Cited

U.S. PATENT DOCUMENTS

| | | | |
|---|---|---|---|
| 2,042,452 A * | 6/1936 | Boyd, Jr. ................... 208/71 |
| 5,200,884 A | 4/1993 | Ohashi | |
| 6,038,136 A * | 3/2000 | Weber ......................... 361/783 |
| 6,046,911 A | 4/2000 | Dranchak et al. | |
| 6,175,509 B1 * | 1/2001 | Koch .......................... 361/809 |
| 6,224,388 B1 | 5/2001 | Ahr et al. | |
| 6,515,355 B1 * | 2/2003 | Jiang et al. ................... 257/678 |
| 6,885,561 B1 * | 4/2005 | Hashemi et al. ............. 361/760 |
| 6,889,430 B2 * | 5/2005 | Jiang et al. .................... 29/840 |
| 7,142,000 B2 * | 11/2006 | Eldridge et al. ............. 324/765 |
| 7,276,802 B2 * | 10/2007 | Hall et al. .................... 257/780 |
| 2007/0046313 A1 * | 3/2007 | Eldridge et al. ............. 324/765 |
| 2007/0165390 A1 * | 7/2007 | Oh et al. ...................... 361/792 |

FOREIGN PATENT DOCUMENTS

| | | |
|---|---|---|
| DE | 84 32 252 U1 | 2/1985 |
| EP | 0 902 500 A2 | 3/1999 |
| GB | 2 168 856 A | 6/1986 |

* cited by examiner

*Primary Examiner*—Tuan T. Dinh
*Assistant Examiner*—Andargie Aychillhum
(74) *Attorney, Agent, or Firm*—McCarthy Tétrault LLP

(57) ABSTRACT

The invention provides a printed circuit board (PCB) for use in an electronic device. The PCB comprises: a top side; a bottom side; an edge between the top side and the bottom side; a cavity from the top side to the bottom side; a region on the top side for mounting an electronic device; and a connector for receiving connections from the electronic device. In the PCB, the connector is located on either the bottom side or the edge of the side of the PCB. The electronic device can be a display module.

19 Claims, 11 Drawing Sheets

ELECTRICAL CONNECTOR AND SYSTEM FOR A COMPONENT IN AN ELECTRONIC DEVICE

FIELD OF THE INVENTION

The invention described herein relates to a connector used in a handheld electronic device. In particular, the invention described herein relates to a connector for a component, such as a LCD display, used in an electronic device, such as a compact handheld electronic device.

BACKGROUND OF THE INVENTION

The conventional handheld electronic device, such as a PDA, or a wireless telephone, includes a keyboard/keypad, a display and a system printed circuit board (PCB) disposed within a common housing. The display is typically provided as a reflective, transmissive or transreflective LCD display panel.

To limit power losses and the effects of noise on the system, the LCD display electronics must be disposed in close proximity to the LCD display panel. Accordingly, the LCD display electronics are provided on a flexible printed circuit board that is housed within a plastic or metal support frame with the LCD display panel. The frame is then fixedly attached to the PCB using known techniques and devices, such as permanent adhesive, clips, screws or snaps. Alternatively, the display panel may be loosely set in its final position on the PCB, when the housing is closed over the PCB and the display panel, internal elements in the housing press onto the display panel to keep it frictionally held against the PCB.

To prevent the display electronics from making contact with electronics and tracks on the PCB, the frame maintains a small gap between the display electronics on the PCB and the electronics on the PCB. However, this design increases the thickness of the electronic device. For instance, in the conventional handheld electronic device, a gap of approximately 1.5 mm is preferably maintained between the display electronics and the PCB electronics (1.2 mm for the height of the display electronics; and an additional 0.3 mm for the clearance between the display electronics and the PCB electronics).

In the case of a wireless-enabled electronic device, typically the antenna and RF electronics are disposed near the uppermost end of the electronic device to avoid attenuation of the RF signal by the user's hand as the user holds the device. Since this position for the RF electronics within the housing coincides with that of the display, the gap between the display electronics and the PCB electronics must be decreased This latter design further increases the need to reduce the gap between the LCD and PCB.

Therefore, there is a need for a configuration of components in a handheld electronic device that allows the thickness of the device to be reduced.

BRIEF DESCRIPTION OF THE DRAWINGS

The invention will now be described, by way of example only, with reference to the accompanying drawings, in which.

DETAILED DESCRIPTION OF AN EMBODIMENT

Figure 1:
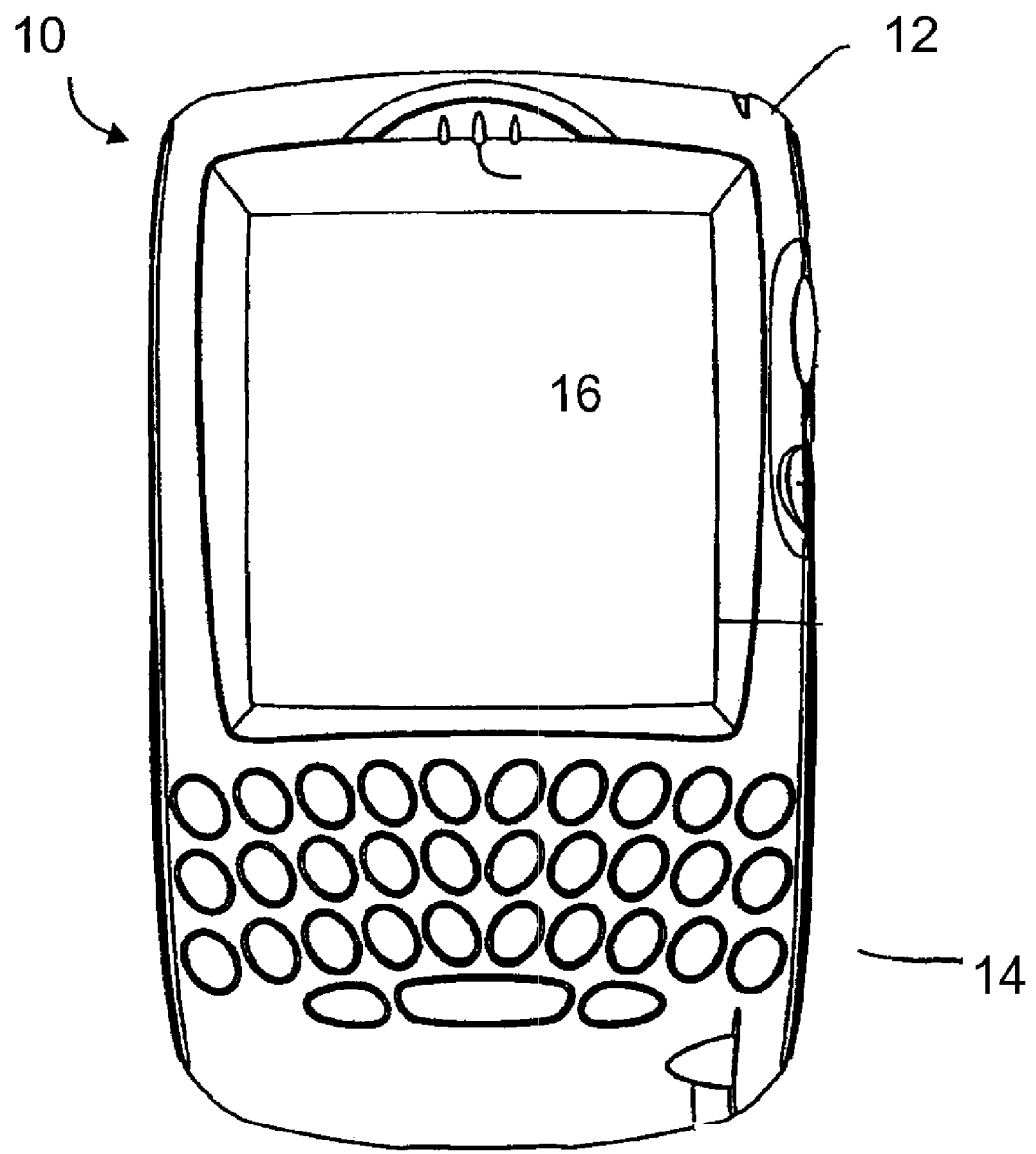
FIG. 1 is a front plan view of a handheld electronic device which provides a housing for embodiments of the invention described herein.

The description which follows, and the embodiments described therein, are provided by way of illustration of an example, or examples, of particular embodiments of the principles of the present invention. These examples are provided for the purposes of explanation, and not limitation, of those principles and of the invention. In the description, which follows, like parts are marked throughout the specification and the drawings with the same respective reference numerals.

In a first aspect of an embodiment, an electronics connection system for an electronic device is provided. The system comprises a printed circuit board (PCB) having a top side, a bottom side and an edge between the top side and the bottom side; and a connector for making an electrical connection with an electronic device. In the device, an electrical pad is located on its bottom side. The electronic device is mountable to the top side of the PCB. Also, the connector is connectable to a connection pad on the PCB which is not on the top side of the PCB.

In the system, when the electronic device is mounted on the PCB in its final location, the connector may not be bent inbetween the bottom of the electronic device and the top of the PCB.

In the system, the connector may move from a first position to a second position as the electronic device is mounted to the top of the PCB. When in the second position, the connector may be biased towards the first position and an end portion of the connector may be in electrical contact with the electrical pad of the electronic device.

In the system, the connector may be connected to the connection pad via a solder connection or a welded connection.

In the system, the end portion of the connector may be a curved tip.

In the system, the connection pad may be located on the bottom side of the PCB.

In the system, the connection pad may be located on an edge of the PCB.

Alternatively, in the system, the connection pad may be located on the bottom side of the PCB; the connector may route around an end of the PCB; and the connector may move from a first position to a second position as the electronic device is mounted to the top of the PCB. When in the second position, the connector is biased towards the first position and an end portion of the connector is in electrical connection with the electrical pad of the electronic device.

In a second aspect, an electronics module for an electronic device is provided. The module comprises: a PCB having a top side, a bottom side and an edge between the top side and the bottom side; an electronic device having a flexible connector, the electronic device being mountable to the top side of the PCB; and a second connector for receiving the first connector. On the PCB, the connector is located on either the bottom side or the edge of the PCB.

In the module, the electronic device may be mounted on the PCB and the flexible connector is not bound between a bottom of the display and the top of the PCB.

In the module, the PCB may comprise a cavity from the top side to the bottom side. Further, the flexible connector may be routed through the cavity from the display to the second connector.

In the module, the second connector may be located on the bottom side of the PCB.

In the module, the flexible connector may be biased at its distal end towards the second connector.

In the module, the second connector may be a solder pad.

Alternatively, in the module, the second connector may be located on an edge of the cavity of the PCB.

In other aspects various combinations of sets and subsets of the above aspects are provided.

FIG. 1 schematically illustrates a handheld mobile communication device 10 and its components, including a housing 12, an input device (e.g. keyboard 14) and an output device (a display 16), which is preferably a graphic liquid crystal display (LCD), although other types of output devices may alternatively be utilized. Typically, housing 12 is a moulded polycarbonate structure and may be formed via known plastic injection moulding techniques. To assist in assembly of device 10, housing 12 typically comprises two or more pieces which fit together in a fitted arrangement to enclose the internal devices and form an exterior casing for device 10. For example, housing 12 may comprise an upper housing and a lower housing. Physically for device 10, housing 12 may be elongated vertically, or may take on other sizes and shapes (including clamshell housing structures).

Figure 2:
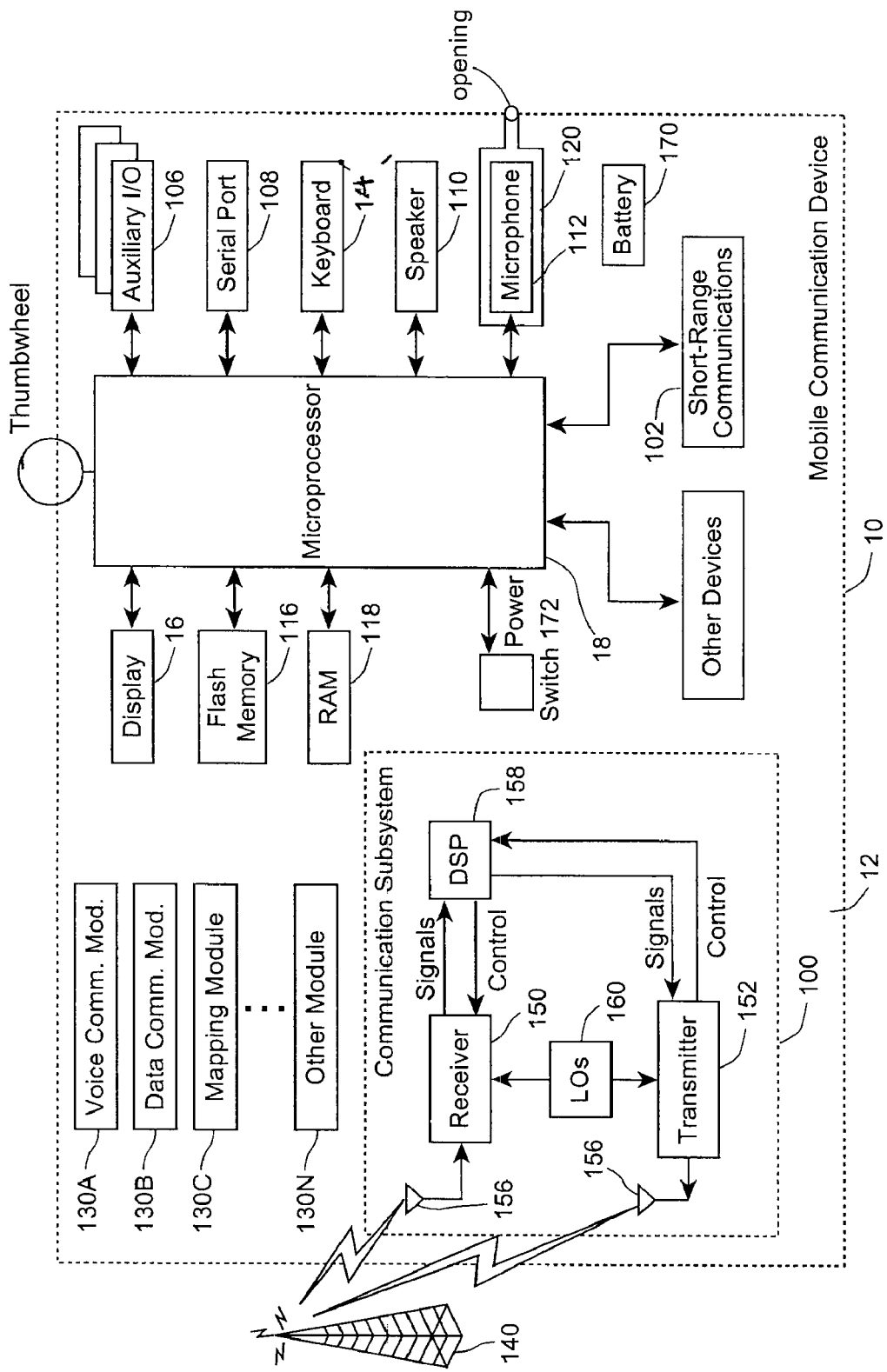
FIG. 2 is a schematic view depicting functional details of the handheld electronic device of FIG. 1, including a communication subsystem and a LCD display.

Referring to FIG. 2, a processing device (a microprocessor 18) is shown schematically as coupled between keyboard 14, display 16 and a series of other internal devices to device 10. The microprocessor 18 controls the operation of the display 16, as well as the overall operation of the device 10, in response to actuation of keys on the keyboard 14 or thumbwheel by a user. Exemplary microprocessors for microprocessor 18 include Data 950 (trade-mark) series microprocessors and the 6200 series microprocessor, both available from Intel Corporation.

In addition to the microprocessor 18, other internal devices of the device 10 are shown schematically in FIG. 2. These devices include: a communication subsystem 100, a short-range communication subsystem 102, a set of auxiliary I/O devices 106, a serial port 108, a speaker 110 and a microphone 112. Memory for device 10 is provided in flash memory 116 and Random Access Memory (RAM) 118. Internal devices are enclosed within housing 12 and typically are either mounted onto a printed circuit board (PCB), affixed to an interior part of the housing or suspended by some means within housing 12.

The device 10 is preferably a two-way radio frequency (RF) communication device having voice and data communication capabilities. In addition, device 10 preferably has the capability to communicate with other computer systems via the Internet.

Operating system software executed by the microprocessor 18 is preferably stored in a computer readable medium, such as flash memory 116, but may be stored in other types of memory devices, such as read only memory (ROM) or similar storage element. In addition, system software, specific device applications, or parts thereof, may be temporarily loaded into a volatile store, such as RAM 118. Communication signals received by the mobile device may also be stored to RAM 118.

Microprocessor 18, in addition to its operating system functions, enables execution of software applications on device 10. A set of software applications that control basic device operations, such as a voice communication module 130A and a data communication module 130B, may be installed on the device 10 during manufacture or downloaded thereafter. Cell mapping module 130C may also be installed on device 10 during manufacture. As well, additional software modules, illustrated as an other software module 130N, which may be, for instance, a personal information manager (PIM) application, may be installed during manufacture or downloaded thereafter into device 10. PIM application is preferably capable of organizing and managing data items, such as e-mail messages, calendar events, voice mail messages, appointments, and task items. PIM application is also preferably capable of sending and receiving data items via a wireless network 140.

Communication functions, including data and voice communications, are performed through the communication subsystem 100, and possibly through the short-range communication subsystem 102. Communication subsystem 100 includes receiver 150, transmitter 152 and one or more antennae, illustrated as receive antenna 154 and transmit antenna 156. In addition, communication subsystem 100 also includes processing module, such as digital signal processor (DSP) 158 and local oscillators (LOs) 160. The specific design and implementation of communication subsystem 100 is dependent upon the communication network in which device 10 is intended to operate. For example, communication subsystem 100 of the device 10 may be designed to operate with the Mobitex (trade-mark), DataTAC (trade-mark) or General Packet Radio Service (GPRS) mobile data communication networks and also designed to operate with any of a variety of voice communication networks, such as Advanced Mobile Phone Service (AMPS), Time Division Multiple Access (TDMA), Code Division Multiple Access CDMA, Personal Communication Service (PCS), Global System for Mobile Communication (GSM), etc. Other types of data and voice networks, both separate and integrated, may also be utilized with device 10. It will be appreciated that some signals received and transmitted through the subsystem 100 may provide interfering signals with other components in device 10, such as microphone 112.

Network access requirements vary depending upon the type of communication system which can communicate with device 10. For example, in the Mobitex (trade-mark) and DataTAC (trade-mark) networks, mobile devices are registered on the network using a unique Personal Identification Number (PIN) associated with each device. In GPRS networks, however, network access is associated with a subscriber or user of a device. A GPRS device therefore requires a subscriber identity module, commonly referred to as a Subscriber Identity Module (SIM) card, in order to operate on a GPRS network.

When required network registration or activation procedures have been completed, device 10 may send and receive communication signals over communication network 140. Signals received from communication network 140 by the receive antenna 154 are routed to receiver 150, which provides for signal amplification, frequency down conversion, filtering, channel selection, etc., and may also provide analog to digital conversion. Analog-to-digital conversion of received signals allows the DSP 158 to perform more complex communication functions, such as signal demodulation and decoding. In a similar manner, signals to be transmitted to network 140 are processed (e.g., modulated and encoded) by DSP 158 and are then provided to transmitter 152 for digital to analog conversion, frequency up conversion, filtering, amplification and transmission to communication network 140 (or networks) via the transmit antenna 156.

In addition to processing communication signals, DSP 158 provides for control of receiver 150 and transmitter 152. For example, gains applied to communication signals in receiver 150 and transmitter 152 may be adaptively controlled through automatic gain control algorithms implemented in DSP 158.

In a data communication mode, a received signal, such as a text message or web page download, is processed by the communication subsystem 100 and is input to microprocessor 18. The received signal is then further processed by microprocessor 18 for an output to the display 16, or alternatively to some other auxiliary I/O devices 106. A device user may also compose data items, such as e-mail messages, using keyboard (keypad) 14, and/or some other auxiliary I/O device 106, such as a touchpad, a thumb-wheel, a rocker switch or some other type of input device. The composed data items may then be transmitted over communication network 140 via communication subsystem 100.

In a voice communication mode, overall operation of device 10 is substantially similar to the data communication mode, except that received signals are output to speaker 110, and received audio signals are provided to microphone 112 for further conversion into an electrical signal and further processing by device 10. Microphone 112 is preferably a silicon-based transducer which can be mounted to PCB 302.

Short-range communication subsystem 102 enables communication between device 10 and other proximate systems or devices, which need not necessarily be similar devices. For example, the short-range communication subsystem may include an infrared device and associated circuits and components, or a Bluetooth™ communication module to provide for communication with similarly-enabled systems and devices.

Powering the entire electronics of the mobile handheld communication device is power source 170. Preferably, the power source 170 includes one or more batteries. More preferably, the power source 170 is a single battery pack, especially a rechargeable battery pack. Power switch 172 provides a separate on/off switch for device 10.

Figure 3:
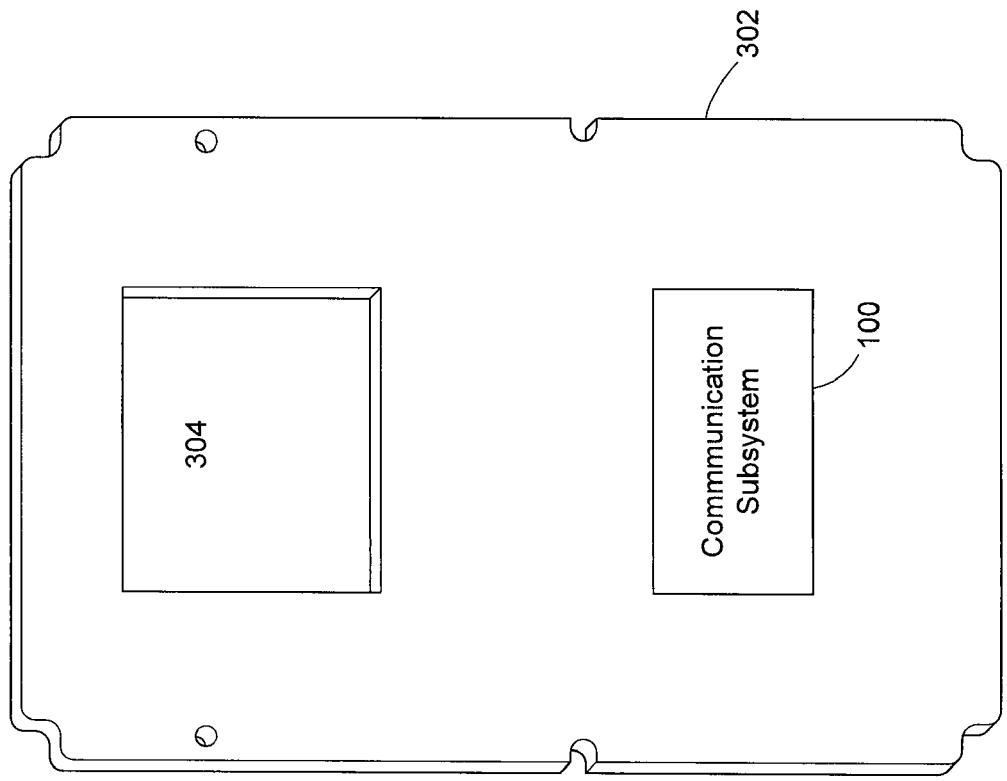
FIG. 3 is an upper perspective view of a printed circuit board (PCB) of the handheld electronic device of FIG. 1, depicting the location of the communication subsystem shown in FIG. 2.

FIG. 3 depicts a physical structure of the PCB 302. Communication subsystem 100 (including the receiver 150, transmitter 152, and antenna elements 156), flash memory 116, RAM 118, I/O subsystems 106, serial port 108, keyboard 14, speaker 110, microphone 120, microprocessor 18, and other elements in FIG. 2 are provided on the PCB 302. The display 16 is physically mounted, and electrically connected, to the PCB 302.

As shown, the communication subsystem 100 is disposed adjacent the lowermost end of the PCB 302. Further, cavity 304 disposed in the uppermost end of the PCB 302. Preferably, the cavity 304 is provided as an aperture or hole that extends through the PCB 302, from the top surface thereof to the bottom surface thereof. In other embodiments, cavity 304 may be provided as a notch in a side of PCB 302.

Figure 5:
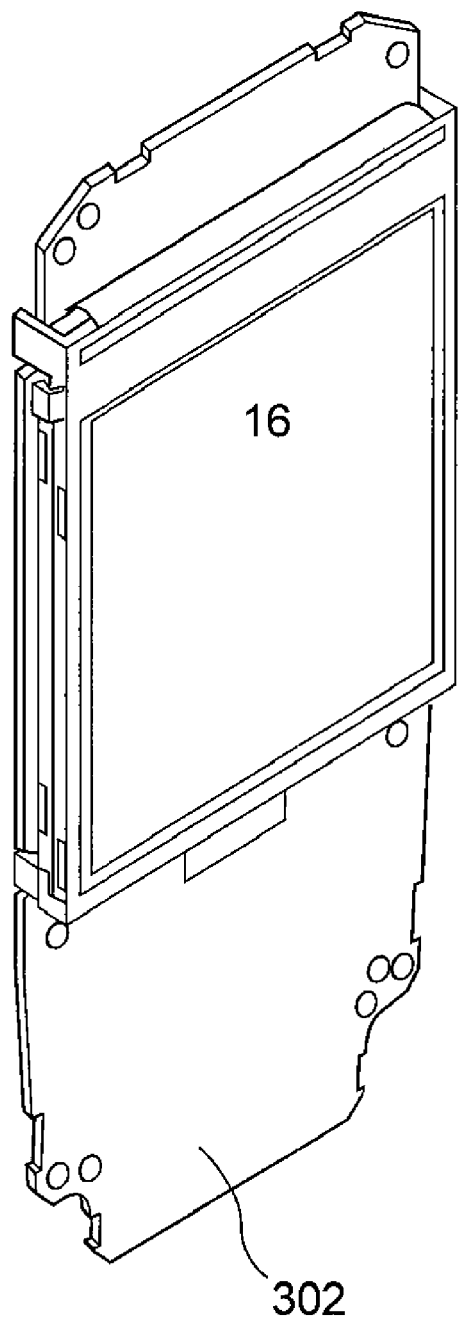
FIG. 5 is upper perspective view of the LCD display of FIG. 4 secured to the PCB of FIG. 3.

For the purposes of illustration, references to top side, bottom side, left and right sides, top and bottom ends are provided using the orientation of PCB 302 as shown in FIG. 5. Therein, the top side of the PCB is the front facing side having display 16 mounted thereto. The top end of the PCB is the end where the display is mounted. These references provide relative positional references for components for convenience only and are not meant to be limiting, unless otherwise noted.

Figure 4:
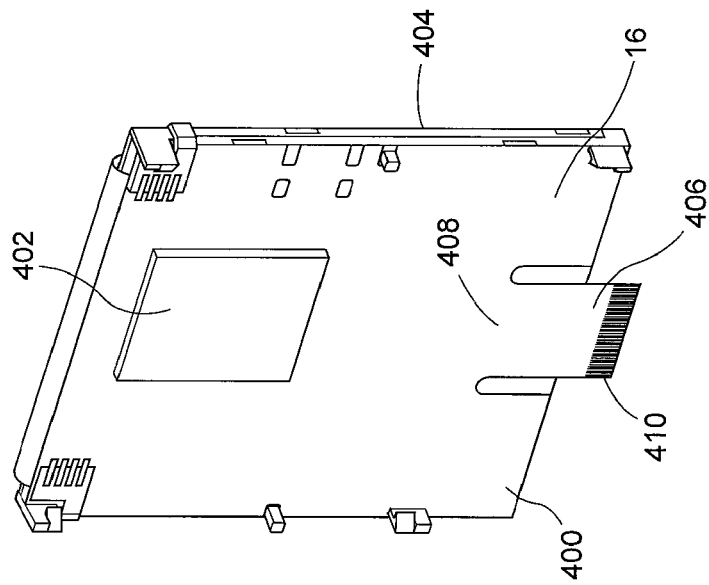
FIG. 4 is a rear perspective view of the LCD display of the handheld electronic device of FIG. 2.

Referring to FIGS. 4 and 5, display 16 is provided as a self-contained unit that includes a display 16 and substrate 400 that carries the display electronics 402. Substrate 400 may be a PCB or any suitable structure capable of supporting Preferably, the display panel comprises a LCD display panel. The display panel and the display electronics 402 are retained together within a common support frame 404. As shown, the LCD display electronics 402 are disposed compactly within a common area on substrate 400. Connector 406 is a flexible ribbon connector typically emanating from a bottom side of display 16 and has a flexible portion 408 and edge connector 410 at a distal end; internal conductors in flexible portion 408 provide electrical connections to components on display 16, such as display electronics 402. As shown, connector 406 is integral to display 16; in other embodiments, connector 406 may be detachable from device 16. Similar to ribbon cables, flexible portion 408 can be biased away from the back of display 16 to position edge connector 410 in a suitable location for mating with another connector.

As shown in FIG. 5, display 16 is mounted to the PCB 302 by aligning LCD display electronics 402 about cavity 304, and then securing the support frame 404 to the PCB 302. Typically, the support frame 404 is secured to the PCB 302 with adhesive or other suitable fasteners. Alignment posts and notches may also be provided in both PCB 302 and support frame 404 to further assist in securing and aligning frame 404 to PCB 302.

When display 16 is mounted to the PCB 302, display electronics 402 preferably extend from substrate 400 into cavity 304. Since display electronics 402 are disposed within cavity 304, only a small gap (e.g. 0.6 mm) need be maintained between the display electronics 402 and components on the PCB 302. This gap is provided to allow the display 16 to move relative to the PCB 302 when the handheld electronic device 10 is subject to an impact, such as when the handheld electronic device 10 is dropped. It also compensates for component height. As will be apparent, this gap is significantly less than that required by conventional handheld electronic devices.

As will be appreciated, although the cavity 304 is shown in this example as an aperture, the cavity 304 can instead by provided as an undercut or recessed area in PCB 302 that has a depth sufficient to accommodate display electronics 402 therein. In this variation, preferably the maximum thickness of the display components 402 is between one and ten times the average depth of the recessed area.

Figure 6:
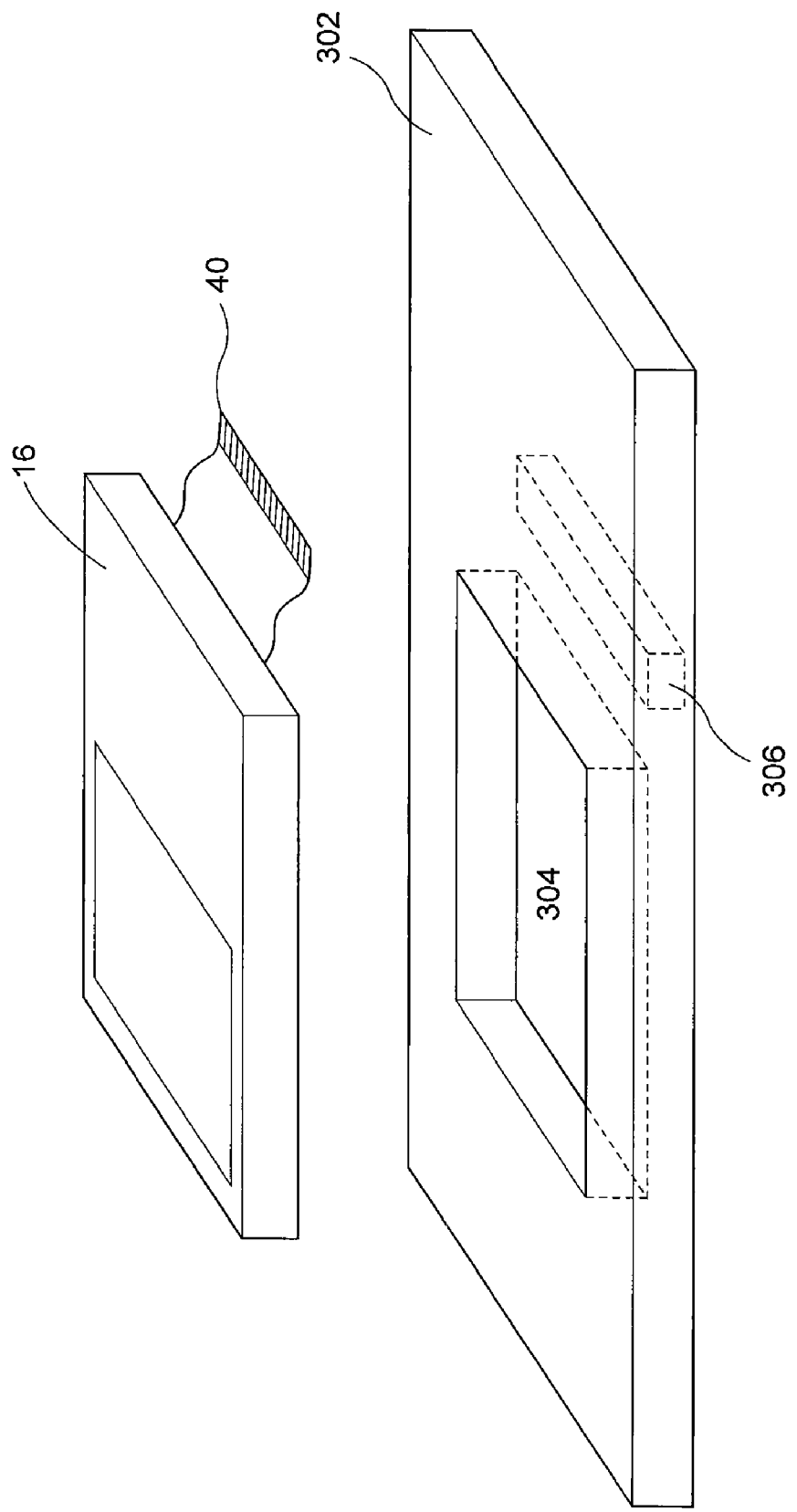
FIG. 6 is an exploded upper perspective view of the LCD display and PCB of FIG. 5.
Figure 7:
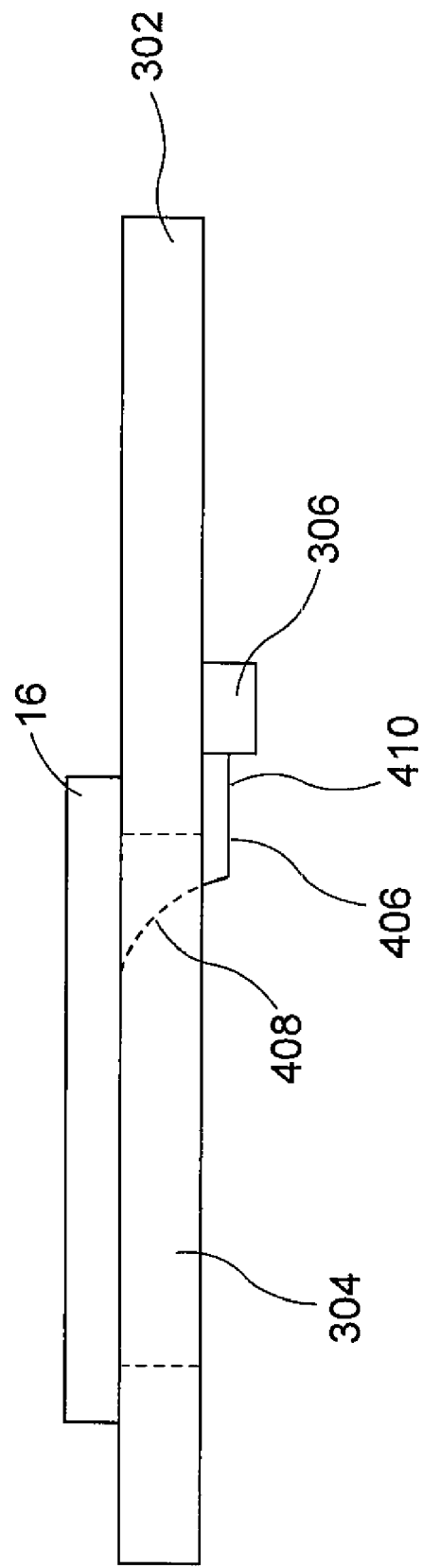
FIG. 7 is a side view of the LCD display and PCB of FIG. 5.

Referring to FIGS. 6 and 7, further details on a connector for display 16 are provided. Therein, prior to mounting display 16 to PCB 302, connector 406 is bent away from the back of display 16 and is fed through the opening of cavity 304 to the bottom side of PCB 302. On the bottom side of PCB 302 edge connector 410 can be inserted into connector 306. In the embodiment, connector 306 may provide a slot, such as a horizontal slot, to mate with the edge connector 410. In this arrangement, connector 406 is not bound or bent between display 16 and PCB 302. As such, its thickness does not need to be accounted for when determining a vertical clearance for the bottom of display 16 to the top of components on PCB 302. In prior art arrangements having a connector located on the top surface of PCB 302, the connector cable for its display would generally have to be sandwiched between the display and the top surface of its PCB. As such, there had to be clearance for the connector cable, thereby either increasing the net vertical height of the display mounted to the PCB or increasing the surface space occupied on the PCB if the connector was not under the display, but adjacent to the displays (as shown in FIG. 5).

Figure 8:
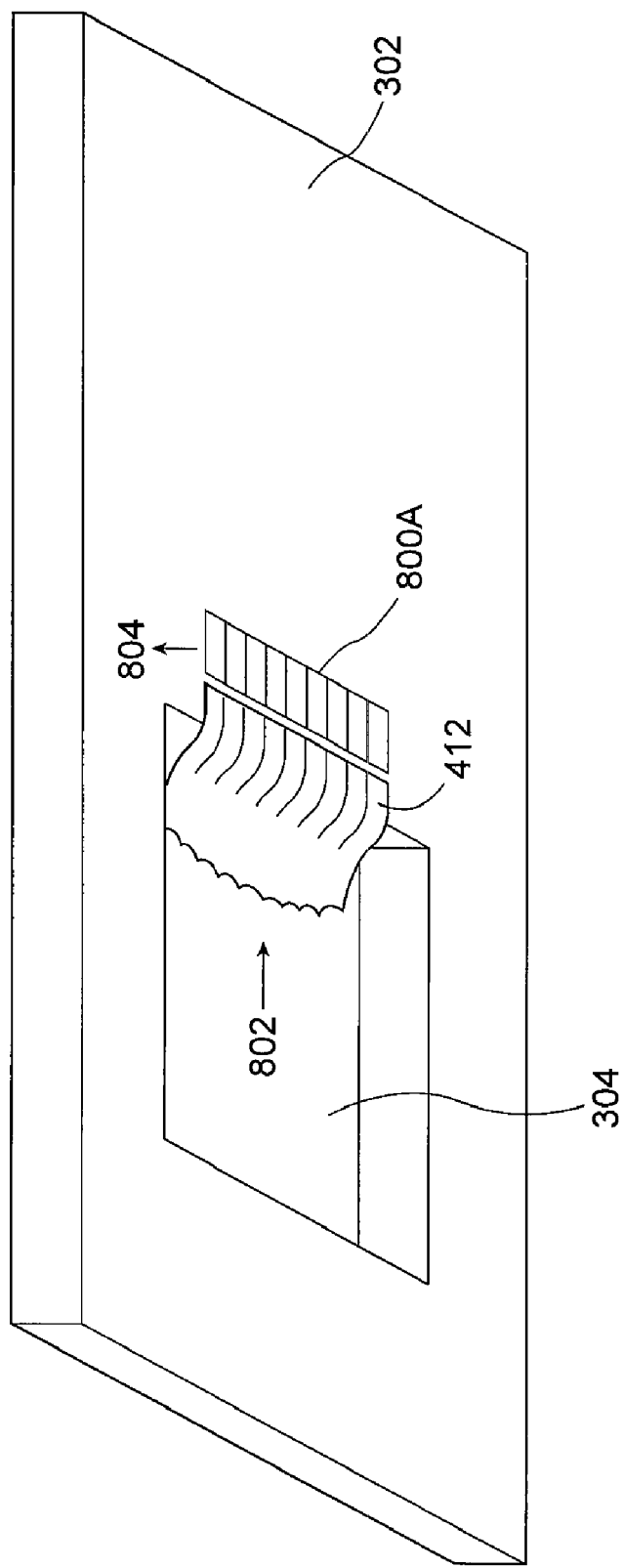
FIG. 8 is a bottom perspective view of another embodiment of a PCB and a connector for the handheld device of FIG. 1.

Referring to FIG. 8, another embodiment is shown wherein PCB 302 is provided, but solder pads 800A on the bottom side of PCB 302 replace connector 306 (of FIG. 7). Also, connector 406 has bare end 412 at its end, instead of connector 410. Solder pads 800A are generally located and positioned on the bottom side of PCB 302 to allow the length of connector 406 to reach their pads. Connector 406 and bare ends 412 may be shaped and formed to be biased upward towards the bottom of PCB 302 when display 16 (not shown) is located in situ. For example, connector 406 may be shaped to provide lateral bias in the direction of arrow 802 for the portion of connector 406 which is located within cavity 304 and is then shaped downward to clear the bottom of cavity 304. Further connector 406 is further shaped to extend laterally towards solder pads 800 and an exterior portion of connector 406, including bare end 412 may be biased upward in the direction of arrow 804 to assist in making bare ends 412 make a better friction contact with pads 800. Solder may be added to pads 800 and bare ends 412 may be soldered to pads 800 using either automated bonding techniques (such as wave soldering) or soldering using hand tools.

Figure 9:
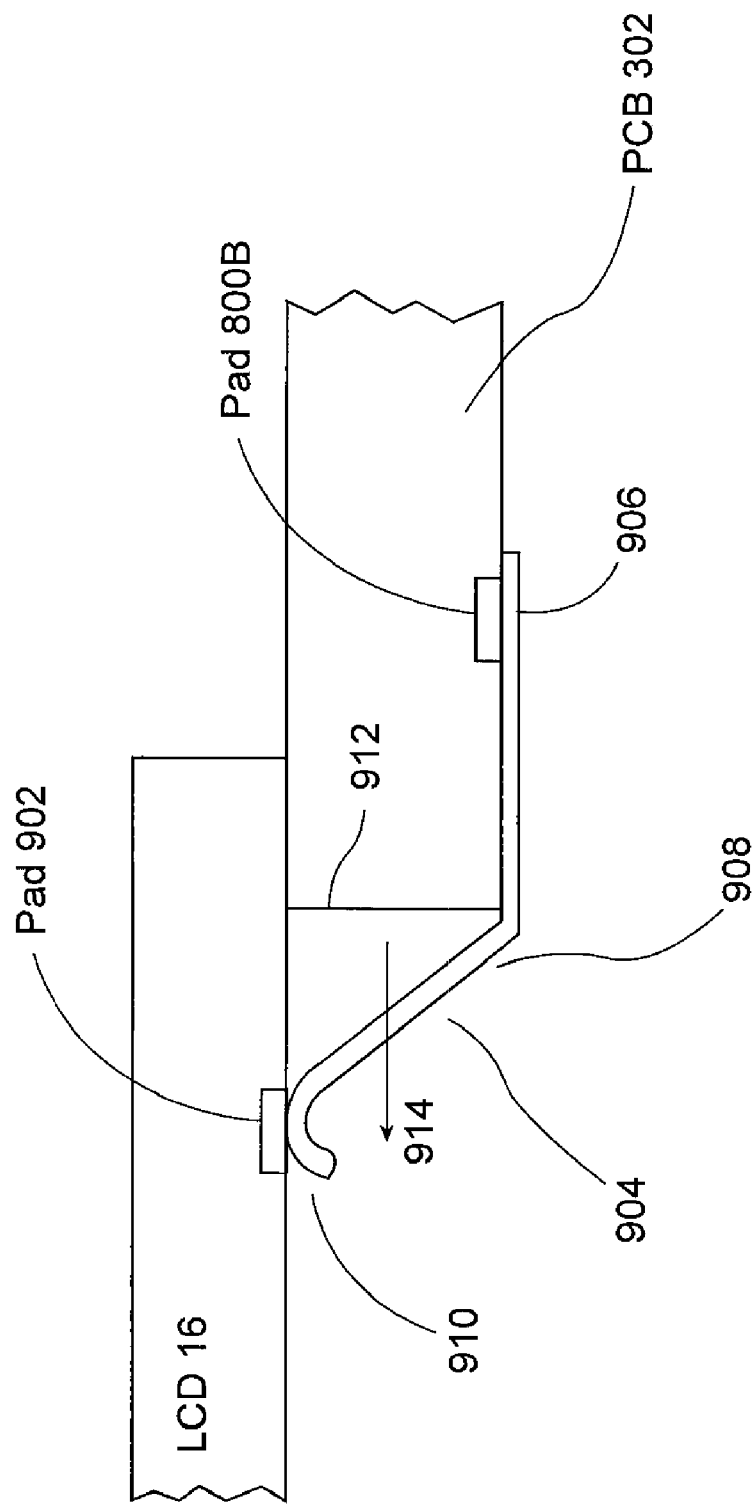
FIG. 9 is a partial side view of yet another embodiment of a PCB and a connector for the handheld device of FIG. 1.

Referring to FIG. 9, yet another embodiment is shown wherein PCB 302 is provided with solder pads 800B provided on the bottom, as described above. In this embodiment, display 16 has electrical connection pads 902 on its bottom side to replace connector 406 (of FIG. 8).

In the connection arrangement of this embodiment, to make an electrical connection between pads 902 and pads 800B, connector 904 is provided. Similar in operation and composition to connectors described above, connector 904 is a set of isolated, insulated parallel conductors; however, at each end of connector 904, the conductors are exposed. PCB end 906 of connector 904 is generally shaped to be flat and align with pads 800B. PCB end 906 may be electrically and physically secured to pads 800B using solder, welding techniques or a friction fit arrangement with an interface (such as a connector, a clamp, a spring latch or a like mechanism).

For the embodiment, pads 902 are located on the bottom portion of display 16 and device 16 is located about cavity 304 such that pads 902 are located above cavity 304. To assist with alignment of connector 904, individual pads 800B and 902 would be aligned in parallel, although other alignments can be implemented.

Middle portion 908 of connector 904 spans between pads 800B and pads 902. As shown. End portion 910 of connector 904 has a curved tip, curving outwardly from side 912 of PCB and downwards towards the cavity. When display 16 is not positioned about opening 304, connector 904 is in a first position, its pre-connection position, and is biased towards side 912 of PCB 302, which is nearest pads 800B. As display 16 is moved to a second position, its final location, the bottom side of display 16 engages end portion 910 and presses down on it. Portion 908 is eased away from its preconnection position and moves outward from side 912 and towards connectors 902, generally in the direction of arrow 914. When display 16 is in its final position, portion 910 make contact with pads 902 thereby completing an electrical connection between pads 902 and pads 800B. In moving from its first position to its second position, as connector 902 is biased to return to its first position, the bias imparts an additional force of connector end 910 against pad 902, thereby enhancing the electrical contact between the two components. In other embodiments, other configurations can be made for the relative locations of pads 902 and 800B and the composition and shape of connector 902. For example, pads 902 may be located on an edge of display 16 and connector 904 may be shaped to engage pads 902.

Figure 10:
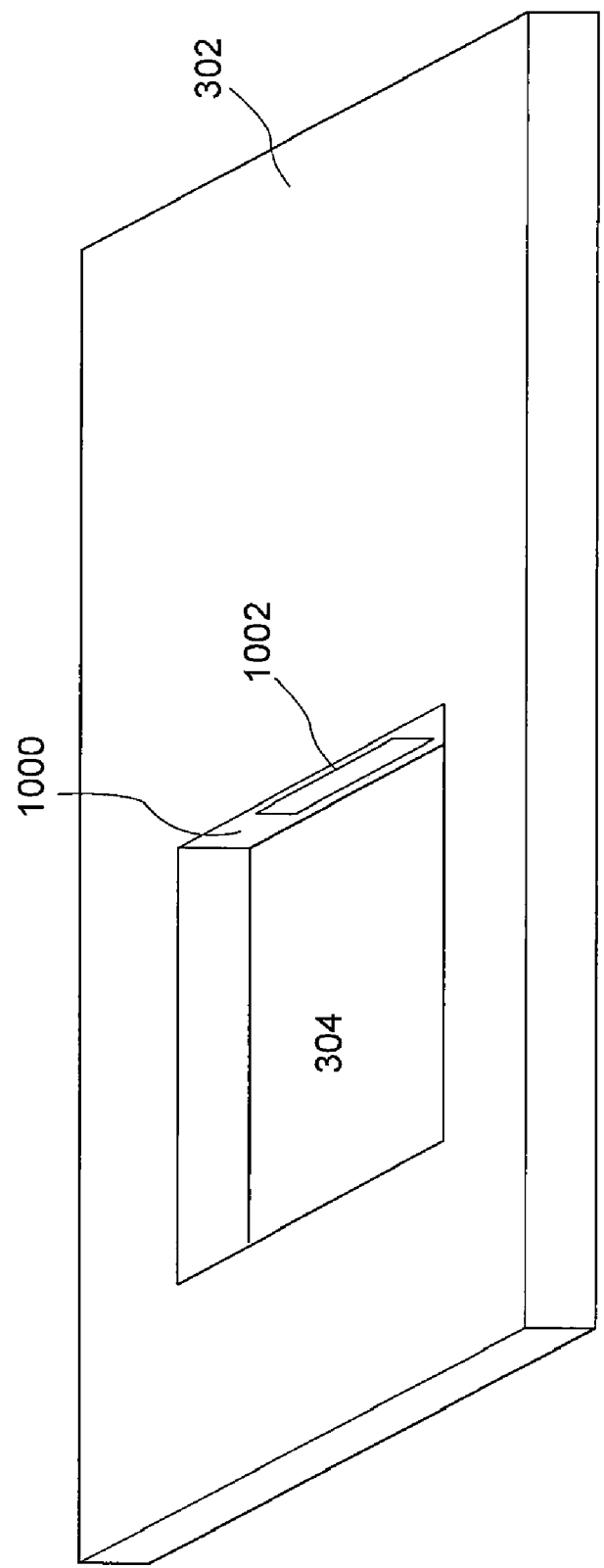
FIG. 10 is an upper perspective view of yet another embodiment showing another PCB for the handheld electronic device of FIG. 1.
Figure 11:
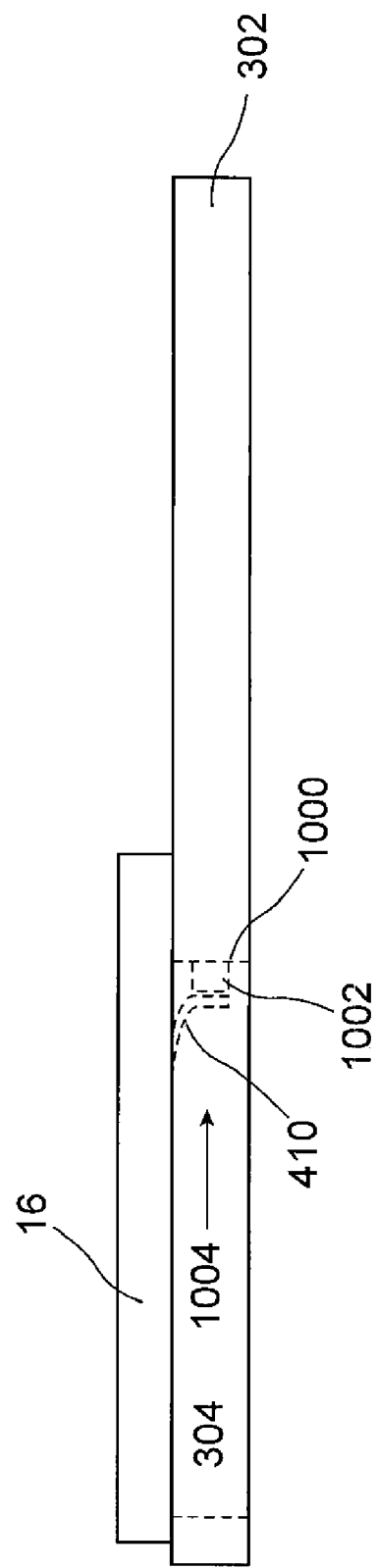
FIG. 11 is side view of the embodiment of FIG. 10 having a display mounted thereto.

Referring to FIGS. 10 and 11, in yet another embodiment, connector 408 is mounted to a connector on the side of cavity 304. In particular, on wall 1000 of cavity 304, an opening is shown for connector 1002. Therein, an end of connector 406 mates with connector 1002. As with earlier described embodiments, connector 406 may be biased towards wall 1000, in the direction of arrow 1004. In other embodiments, connector 1002 is replaced with a set of solder pads, similar to solders pads 800 (FIG. 8), which are located on wall 1000. For these other embodiments, connector 406 will have bare ends, similar to bare ends 412 (FIG. 8).

In other embodiments, as a variation on PCB 302, instead of having a cavity, like cavity 302, being completely contained within the borders of a PCB, an alternative cavity may be provided as a notch on one side of the PCB. Therein connector 408 may be fed through the notch from the top side of the PCB to the bottom side thereof. In other embodiments, two separate PCBs may be provided where they are placed in a spaced relationship to each other with the spaced relationship defining a gap between the two PCBs. Therein, the display may be positioned to span at least partway between the two PCBs and then its connector may be positioned to mate with a connector on a bottom side of one of the PCBs.

Figure 12:
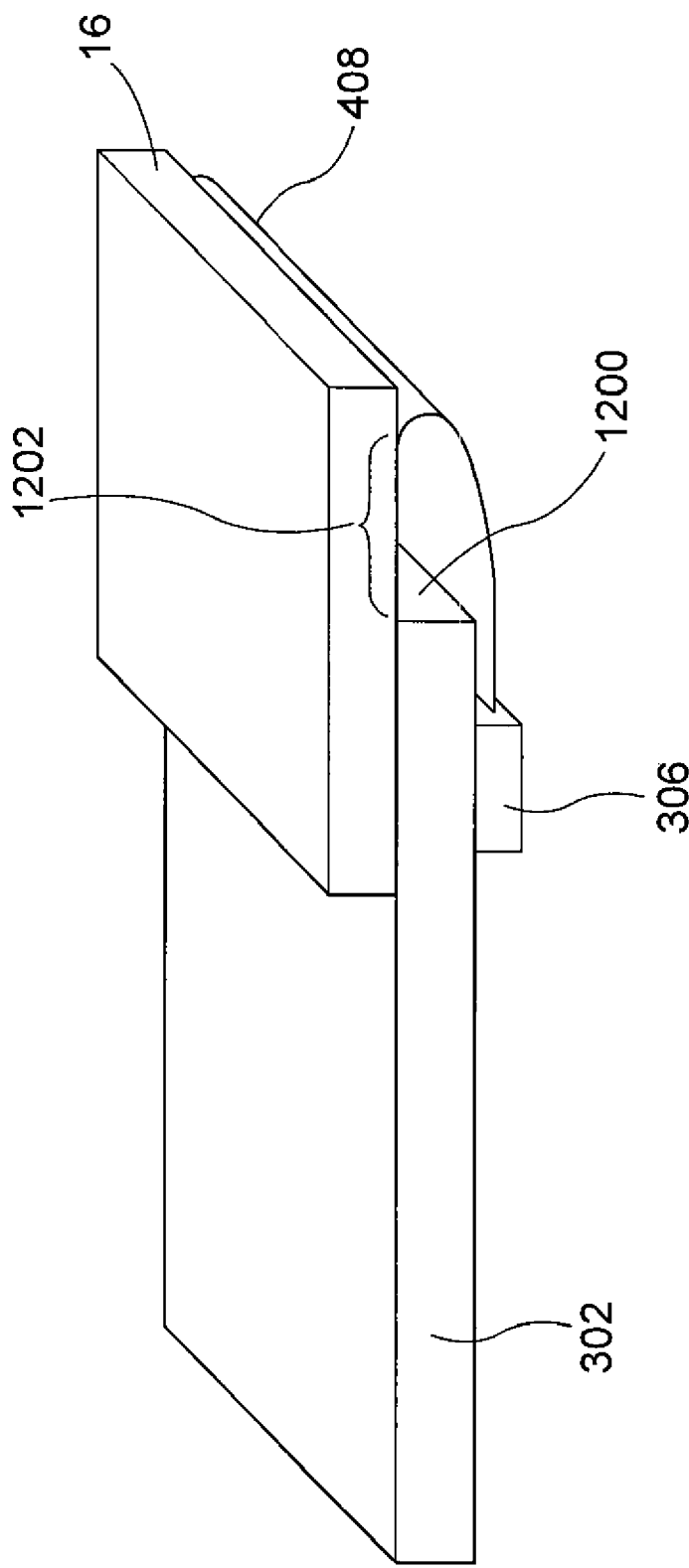
FIG. 12 is an upper perspective view of yet another embodiment showing another PCB and another LCD display for the handheld electronic device of FIG. 1.

Referring to FIG. 12, another embodiment is shown where display 16 overhangs an exterior edge 1200 of PCB 302. Therein, connector 408 extends from the overhanging portion 1202 of display 16 and is shaped to mate with connector 306 on the bottom thereof. As is shown in FIG. 8, connector 408 is bent such that it is turned through an approximately 90° angle, two 90° angle bends to end up in a position which is approximately 180° from its original orientation. In other embodiments, if connector 408 is positioned to project downwards towards connector 306 and as such, does not have to be bent to change its orientation. It will be appreciated that a variation of this embodiment may have solder pads, similar to solder pads 800A (FIG. 8) placed on the bottom of PCB 302 in lieu of connector 306. Alternatively still, a connector or a set of solder pads may be provided on an exterior edge 1200 of PCB 302. Alternatively still, a variation on the connector arrangement shown in FIG. 9 may be used.

It will be appreciated that various PCBs and displays described herein form an electronics module which has a slim vertical profile. It will be appreciated that the term "connector" may be used to refer to any connector, bridge, solder pad, clamp, receptacle, spring-loaded mounting device or generally any means on the PCB which enables a connector for a display cable to be secured thereto and provide an electrical connection to devices on the PCB.

It will further be appreciated that cavity 304 shown in FIGS. 6-11, as well as the overhanging arrangement of the display and the PCB shown in FIG. 12 are embodiments wherein the connector for a display is mated to a connector on the PCB. The PCB connector is located on a region that is not on the side of the PCB on which the display is mounted. The display connector is fed through a cavity or over an open edge of the PCB to reach the connector on the PCB.

Further still, although the embodiments have been described in terms of a display with a connector being connected to the PCB and a connection system therefor, in other embodiments, other electronic devices, not necessarily incorporating a display, but having a similar connector to those described herein may be used. Such electronic devices may include a daughterboard, a microprocessor, memory devices and electro-mechanical devices, such as relays.

The present invention is defined by the claims appended hereto, with the foregoing description being merely illustrative of a preferred embodiment of the invention. Those of ordinary skill may envisage certain modifications to the foregoing embodiments which, although not explicitly discussed herein, do not depart from the scope of the invention, as defined by the appended claims.

We claim:

1. An electronics connection system for an electronic device, comprising:
   an electronic component having a substrate, a first connector and a feature projecting downward from a bottom side of said substrate;
   a support frame for said electronic component;
   a printed circuit board (PCB) having a top side, a bottom side, at least one edge connecting said top side and said bottom side, and a cavity from said top side to said bottom side; and
   a second connector for making an electrical connection to said first connector, said second connector being located on said bottom side of said PCB,
   wherein when said electronic component is mounted to said support frame and said support frame is mounted on said PCB, said first connector is routed through said cavity to mate with said second connector, said feature projects from said substrate into said cavity, and said electronic component has a clearance gap of up to 0.6 centimeters between said bottom side of said substrate and any component on said PCB underneath said electronic component.

2. The electronics connection system as claimed in claim 1, wherein said electronic component is a display.

3. The electronics connection system as claimed in claim 2, wherein:
   said support frame comprises an alignment post; and
   said PCB comprises a notch to receive said alignment post.

4. The electronics connection system as claimed in claim 2, wherein the first connector is a flexible bus of parallel, insulated wires.

5. The electronics connection system as claimed in claim 2, wherein said second connector is an electrical pad located on said bottom side of said PCB.

6. The electronics connection system as claimed in claim 4, wherein said first connector is routed through said cavity without making electrical contact with the sides of said cavity.

7. A mobile communication device, comprising:
   a display module having a substrate, a first connector and a feature projecting downward from a bottom side of said substrate;
   a support frame for said display module;
   a printed circuit board (PCB) having a top side, a bottom side, at least one edge connecting said top side and said bottom side, and a cavity from said top side to said bottom side; and
   a second connector for making an electrical connection said first connector, said second connector being located on said bottom side of said PCB, wherein
   when said display module is mounted to said support frame and said support frame is mounted on said PCB, said first connector is routed through said cavity to mate with said second connector; and
   said feature projects from said substrate into said cavity.

8. The mobile communication device as claimed in claim 7, wherein:
   said support frame further comprises an alignment post; and
   said PCB comprises a notch to receive said alignment post.

9. The mobile communication device as claimed in claim 7, wherein the first connector is a flexible bus of parallel, insulated wires.

10. The mobile communication device as claimed in claim 7, wherein said second connector is an electrical pad located on said bottom side of said PCB.

11. The mobile communication device as claimed in claim 8, wherein when said support frame with said display module is mounted to said PCB, a clearance gap of up to 0.6 centimeters is provided between said bottom side of said substrate of said electronic component and any component on said PCB that is underneath said electronic component.

12. The mobile communication device as claimed in claim 9, wherein said first connector is routed through said cavity without making electrical contact with the sides of said cavity.

13. An electronics connection system for an electronics device, comprising:
   an electronic component having a substrate, a first connector pad on a bottom side of said substrate and a feature projecting downward from said bottom side of said substrate;
   a support frame for mounting said electronic component;
   a printed circuit board (PCB) having a top side, a bottom side, at least one edge connecting said top side and said bottom side, a cavity from said top side to said bottom side and a second connector pad located on said bottom side of said PCB; and
   a connector providing an electrical connection between said first and second connector pads and said connector being initially electrically connected to said second connector pad and routed through said cavity to mate with said first connector pad, wherein
   as said electronic component mounted in said support frame is mounted on said PCB said connector moves from a first position to a second position where said connector is biased towards said first position and an end portion of said connector is in electrical contact with said first connector pad of said electronic device; and
   when said electronic component is mounted on said PCB, said feature projects from said substrate into said cavity.

14. The electronics connection system as claimed in claim 13, wherein said electronic component is a display.

15. The electronics connection system as claimed in claim 14, wherein:
   said support frame comprises an alignment post; and
   said PCB comprises a notch to receive said alignment post.

16. The electronics connection system as claimed in claim 14, wherein said connector is connected to said second connection pad via a solder connection or a welded connection.

17. The electronics connection system as claimed in claim 15, wherein when said electrical component in said support frame is mounted to said PCB, a gap is present between said component and any component on said PCB that is underneath said electronic component.

18. The electronics connection system as claimed in claim 16, wherein said end portion is a curved tip.

19. The electronics connection system as claimed in claim 17, wherein the gap is up to 0.6 centimeters.

* * * * *